(12) United States Patent  
Liu et al.

(10) Patent No.: US 8,878,628 B2  
(45) Date of Patent: Nov. 4, 2014

(54) NETWORK SIGNAL COUPLING CIRCUIT

(75) Inventors: You-Chi Liu, Taipei (TW); Chia-Ping Mo, Taipei (TW)

(73) Assignee: Ajoho Enterprise Co., Ltd., Taipei (TW)

( * ) Notice: Subject to any disclaimer, the term of this patent is extended or adjusted under 35 U.S.C. 154(b) by 338 days.

(21) Appl. No.: 13/544,538

(22) Filed: Jul. 9, 2012

(65) Prior Publication Data

US 2013/0265118 A1    Oct. 10, 2013

(30) Foreign Application Priority Data

Apr. 6, 2012    (TW) .............................. 101112238 A

(51) Int. Cl.
   *H03H 7/38*        (2006.01)
(52) U.S. Cl.
   USPC ............................ 333/131; 333/181; 333/185
(58) Field of Classification Search
   USPC ......................................... 333/131, 181, 185
   See application file for complete search history.

(56) References Cited

U.S. PATENT DOCUMENTS 8,319,579 B2 *    11/2012    Zhuang et al. .............. 333/28 R

* cited by examiner

*Primary Examiner* — Robert Pascal  
*Assistant Examiner* — Kimberly Glenn  
(74) *Attorney, Agent, or Firm* — Muncy, Geissler, Olds & Lowe, P.C.

(57) ABSTRACT

A network signal coupling circuit installed in a circuit board and electrically coupled between a network-on-chip and a network connector is disclosed to include a coupling module installed each channel thereof, each coupling module including two capacitors respectively electrically connected in series to the two circuits of the respective channel, two sets of equivalent resistors respectively electrically connected in parallel to opposing ends of the capacitors, and two signal equivalent grounding terminals respectively electrically connected to the two sets of equivalent resistors; by means of the characteristic of the capacitors that the strength increases when the frequency rises, the signal coupling performance of the signal coupling circuit is relatively enhanced when the applied network frequency is increased.

10 Claims, 7 Drawing Sheets

NETWORK SIGNAL COUPLING CIRCUIT

This application claims the priority benefit of Taiwan patent application number 101112238 filed on Apr. 6, 2012.

BACKGROUND OF THE INVENTION

1. Field of the Invention

The present invention relates to network technology and more particularly, to a network signal coupling circuit, which uses coupling modules to enhance the signal coupling performance subject to the characteristic of capacitors that the strength increases when the frequency rises.

2. Description of the Related Art

Following fast development of computer technology, desk computers and notebook computers are well developed and widely used in different fields for different applications. It is the market trend to provide computers having high operating speed and small size. Further, network communication technology brings people closer, helping people to gather information about living, learning, working and recreational activities. By means of network communication, people can communicate with one another to send real time information, advertising propaganda or e-mail. Further, through the Internet, people can search information, send instant messages, or play on-line video games. The development of computer technology makes the relationship between people and network unshakable and inseparable.

Connecting a computer or electronic apparatus to a network for data transmission can be done by a cable connection technique or a wireless transmission protocol. A cable connection technique needs the installation of a network connector. A conventional network connector has built therein transformer modules and common-mode suppression modules. As shown in FIG. 5, a conventional network connector comprises a circuit board A, and multiple transformer coils B and filter coils C installed in the circuit board A. Each of the transformer coils B and filter coils C comprises a wire core D, and a lead wire D1 wound round the wire core D with the ends thereof bonded to respective contacts at the circuit board A. Because the winding of the transformer coils B and the filter coils C cannot be achieved by an automatic machine and must be done by labor, the fabrication efficiency of this kind of network connector is low. Further, the lead wire may be broken easily during winding, thereby increasing the cost. Further, fabrication by labor cannot accurately control the coil winding tightness and number of turns, affecting product quality stability.

Further, following the development of network application technology, network data transmission capacity has been greatly increased. To satisfy the demand for high data transmission capacity, network transmission speed has been greatly improved from the early 10 Mbps to 100 Mbps or 1 Gbps. Nowadays, fiber-optic network transmission speed can be as high as 10 Gbps and up. A transformer coil B is an inductor, the impedance (Z) of an inductor is an inductive reactance, and its unit is ohm (a). The inductive reactance is calculated subject to the equation of $Z=2\pi*f*L$, in which: f=frequency and its unit is hertz (Hz); L=inductance of inductor and its unit is Henry (H). The aforesaid network connector utilizes the characteristic of the inductance of the transformer coils B to isolate electricity and to couple signals. In order to transmit signals from the primary side to the secondary side, each transformer coil B must have a predetermined inductance. From the above equation, it is known that inductive reactance is directly proportional to the working frequency and the inductance of the inductor. When increasing the signal frequency, the inductance reactance will be relatively increased (see the comparative curve of frequency and capacitive reactance based on a 350 µH capacitor shown in FIG. 6). However, increased inductive reactance causes increased signal attenuation, leading to network disconnection or dramatic slowdown in network transmission speed. As shown in FIG. 7, when the insertion loss of the transformer reaches −3 db, the response frequency becomes 0.45 MHz~240 MHz. When over this range, the insertion loss will increase rapidly. Therefore, the working frequency must be controlled within a relatively narrower bandwidth. Further, subject to the characteristic curve of the transformer coils B of low frequency with low strength, middle frequency with high strength and high frequency with low strength, when the network transmission speed reaches 1 Gbps, the signal strength of the transformer coils B will be lowered, unable to meet the product requirements.

Therefore, there is a strong demand for a network signal coupling circuit, which eliminates the drawbacks of instable quality, high cost, automated production incapability and low signal strength under a high network transmission speed of the prior art network connector design.

SUMMARY OF THE INVENTION

The present invention has been accomplished under the circumstances in view. It is therefore the main object of the present invention to provide a network signal coupling circuit, which uses coupling modules to enhance the signal coupling performance subject to the characteristic of capacitors that the strength increases when the frequency rises.

To achieve this and other objects of the present invention, a network signal coupling circuit is installed in a circuit board and electrically coupled between a network-on-chip and a network connector. The network signal coupling circuit has a coupling module installed each channel thereof. Each coupling module comprises two capacitors respectively electrically connected in series to the two circuits of the respective channel, two sets of equivalent resistors respectively electrically connected in parallel to opposing ends of the capacitors, and two signal equivalent grounding terminals respectively electrically connected to the two sets of equivalent resisters. By means of the characteristic of the capacitors that the strength increases when the frequency rises, the signal coupling performance of the signal coupling circuit is relatively enhanced when the applied network frequency is increased.

Further, one of the signal equivalent grounding terminals that is connected to the set of equivalent resistors at one end of the capacitors of the respective coupling module is a grounding terminal, and the other of the signal equivalent grounding terminals that is connected to the set of equivalent resistors at the other end of the capacitors of the respective coupling module is a power supply voltage. Subject to the arrangement of the grounding terminal and the power supply voltage, the invention achieves impedance matching.

Further, the capacitor at each circuit of each channel and the respective two connected equivalent resistors constitute a respective π loop. This circuit design simply uses regular electronic components that can be directly bonded to a circuit board by an automatic machine without wire winding by labor, facilitating component quality control.

DETAILED DESCRIPTION OF THE PREFERRED EMBODIMENT

Figure 1:
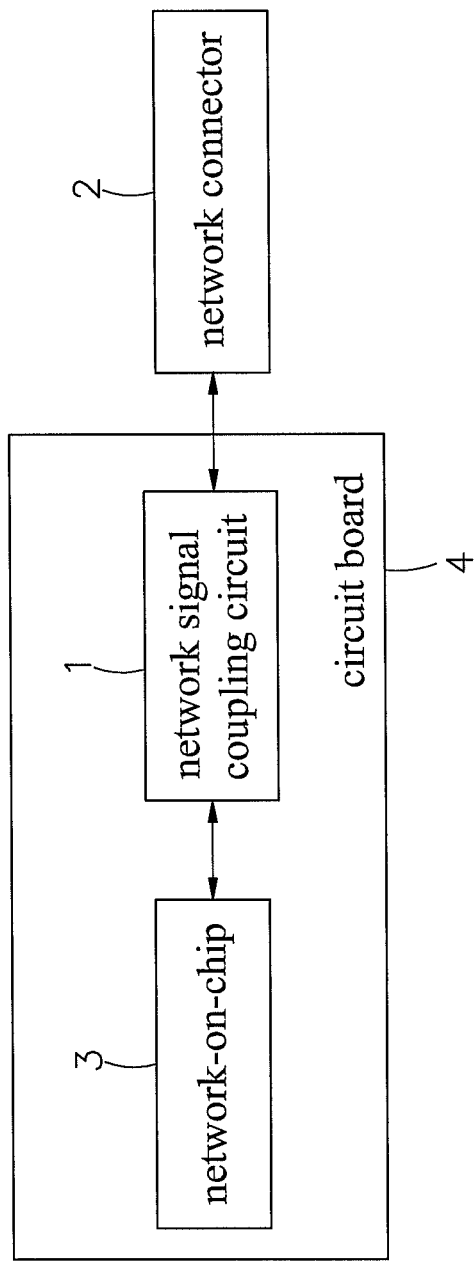
FIG. 1 is a block diagram of the invention.
Figure 2:
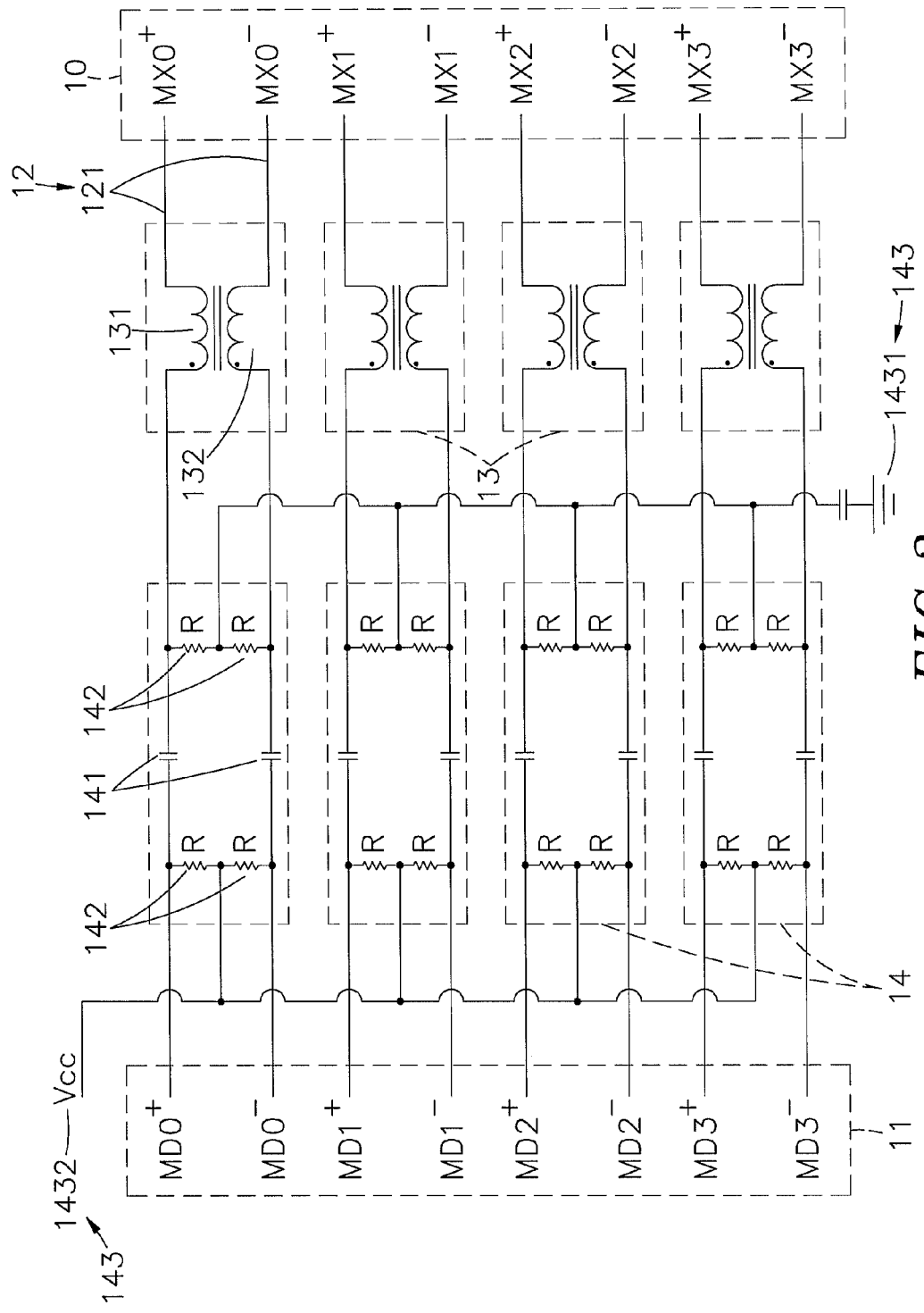
FIG. 2 is a circuit diagram of a network signal coupling circuit in accordance with the present invention.
Figure 3:
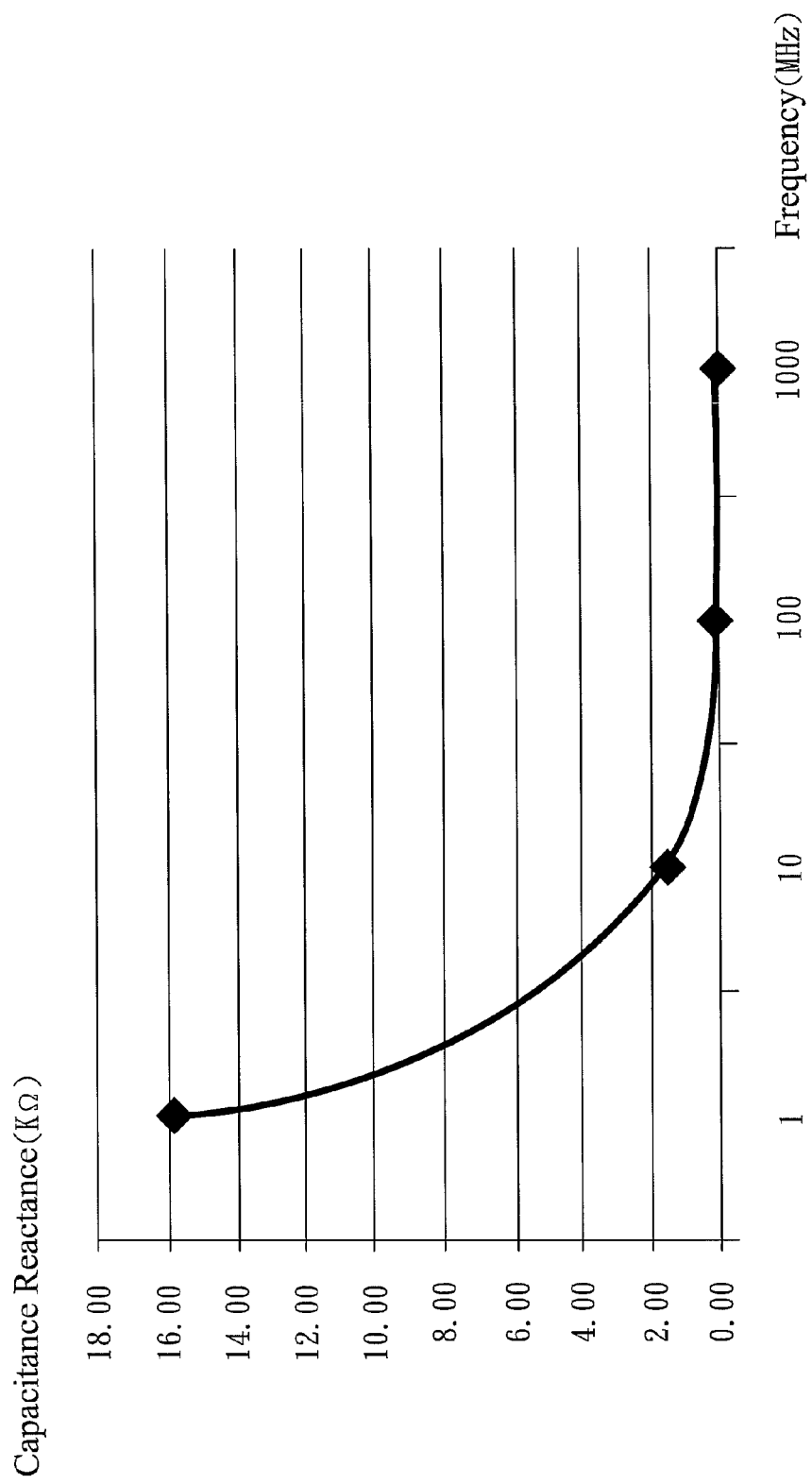
FIG. 3 is a comparative curve of frequency and capacitive reactance of the invention.

Referring to FIGS. 1, 2 and 3, a block diagram, a circuit diagram of a network signal coupling circuit and a comparative chart of frequency and capacitive reactance of the present invention are shown. As illustrated, the network signal coupling circuit 1 is installed in a circuit board 4, having a first connection end 10 thereof electrically coupled to a network connector 2 and an opposing second connection end 11 thereof electrically coupled to a network-on-chip 3.

The network signal coupling circuit 1 comprises a plurality of channels 12, each channel 12 comprising two circuits 121, a plurality of filter modules 13 installed in the channels 12 and electrically coupled between the first connection end 10 and the second connection end 11, and a plurality of coupling modules 14 installed in the channels 12 and respectively electrically coupled between the filter modules 13 and the second connection end 11. Each filter module 13 comprises a first coil 131 and a second coil 132 respectively electrically connected in series to the two circuits 121 of the respective channel 12. Each coupling module 14 comprises two capacitors 141 respectively electrically connected to the two circuits 121 of the respective channel 12, two sets of equivalent resistors 142 respectively electrically connected in parallel to opposing ends of the capacitors 141, and two signal equivalent grounding terminals 143 respectively electrically connected to the two sets of equivalent resistors 142.

The first coil 131 and second coil 132 of each filter module 13 that are respectively connected to the two circuits 121 of the respective channel 12 are arranged side by side to filtrate signals. The signal equivalent grounding terminal 143 that is electrically coupled with the equivalent resistors 142 of the coupling modules 14 at one end of the capacitors 141 being disposed relatively closer to the first connection end 10 of the network signal coupling circuit 1 is a grounding terminal 1431. The signal equivalent grounding terminal 143 that is electrically coupled with the equivalent resistors 142 of the coupling modules 14 at the other end of the capacitors 141 being disposed relatively closer to the second connection end 11 of the network signal coupling circuit 1 is a power supply voltage 1432. Further, the equivalent resistors 142 of the coupling modules 14 at one end of the capacitors 141 being disposed relatively closer to the first connection end 10 of the network signal coupling circuit 1 are electrically connected in series to the grounding terminal 1431. Further, the equivalent resistors 142 of the coupling modules 14 at one end of the capacitors 141 being disposed relatively closer to the second connection end 11 of the network signal coupling circuit 1 are electrically connected in series to the power supply voltage 1432.

The first connection end 10 and second connection end 11 of the network signal coupling circuit 1 are respectively electrically connected to conducting pins of the network connector 2 and conducting pins of the network-on-chip 3, wherein the circuits 121 of the channels 12 of the network signal coupling circuit 1 are configured to be MD0+/MX0+; MD0−/MX0−; MD1+/MX1+; MD1−/MX1−; MD2+/MX2+; MD2−/MX2−; MD3+/MX3+; MD3−/MX3−. However, this configuration layout is changeable to fit different design requirements.

Further, the capacitor 141 at each circuit 121 of each channel 12 and the respective two connected equivalent resistors 142 constitute a respective π loop. The two π loops in each channel 12 are symmetric.

As stated above, the signal equivalent grounding terminal 143 that is electrically coupled with the equivalent resistors 142 of the coupling modules 14 at one end of the capacitors 141 being disposed relatively closer to the first connection end 10 of the network signal coupling circuit 1 is a grounding terminal 1431, and the signal equivalent grounding terminal 143 that is electrically coupled with the equivalent resistors 142 of the coupling modules 14 at the other end of the capacitors 141 being disposed relatively closer to the second connection end 11 of the network signal coupling circuit 1 is a power supply voltage 1432. The capacitors 141 in each channel 12 have the opposing ends thereof respectively electrically coupled with the respective equivalent resistors 142 to achieve impedance matching subject to different application requirements. The matching capacitors 141 are 0.1μfarad capacitors; the equivalent resistors 142 closer to the network-on-chip 3 are 49.9Ω resistors; the equivalent resistors 142 closer to the network connector 2 are 75Ω resistors; the impedance (Z) of the capacitors is a capacitive reactance of which the unit is ohm ($\neq$). The capacitive reactance is measured subject to the equation of $Z=\frac{1}{2}(2\pi \ast f \ast \pi \ast C)$, in which: f=frequency and its unit is hertz (Hz); C=capacitance and its unit is farad (F). The invention utilizes the characteristics of the capacitors to isolate electricity and to couple signal. From the above equation, we can know that the capacitive reactance is indirectly proportional to the working frequency and the capacitance. Thus, when the capacitance of the capacitors 141 remains unchanged and the signal frequency is increased, the capacitance reactance will be relatively reduced (see 0.01 μF capacitors' frequency and capacitive reactance comparison chart shown in FIG. 3), and signal attenuation will also be relatively reduced, achieving better network linking performance and faster signal transmission speed. By means of the characteristic that the strength of capacitor rises subject to increase of frequency, capacitors are effective for use in a high-frequency (wideband) network (greater than 1 Gbps) to isolate electricity in creating electric field induction for coupling signals. Further, the characteristic of the capacitors can also enhance coupling of high-frequency network signals.

Figure 4:
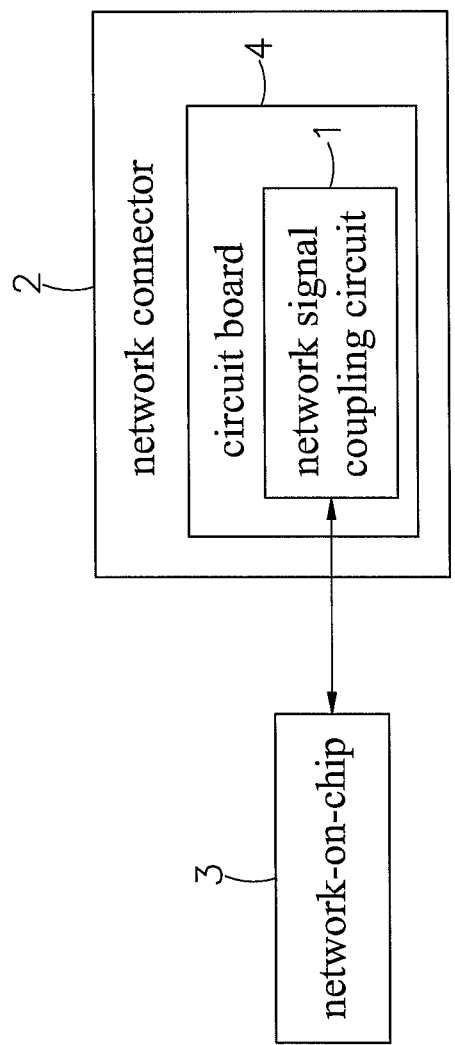
FIG. 4 is a block diagram of an alternate arrangement of the invention.
Figure 5:
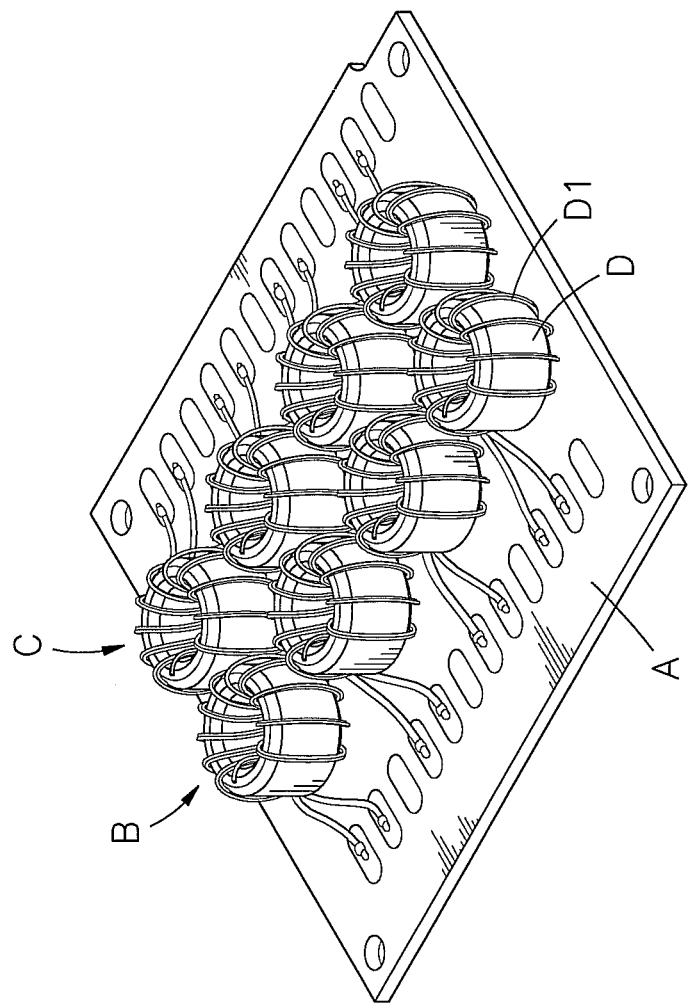
FIG. 5 illustrates the arrangement of transformer coils and filter coils on a circuit board according to the prior art.
Figure 6:
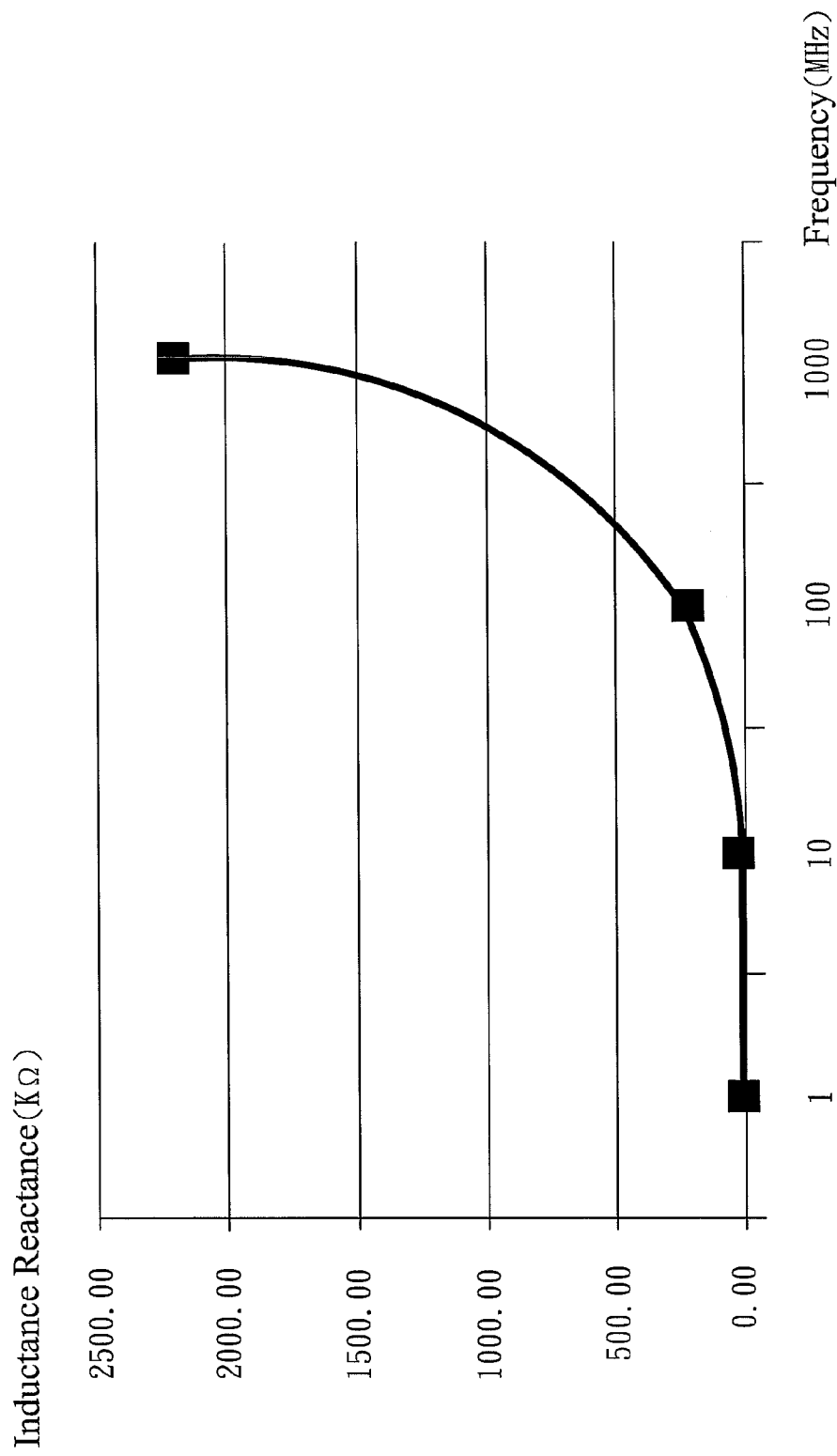
FIG. 6 is a comparative curve of frequency and inductance reactance of the prior art design.
Figure 7:
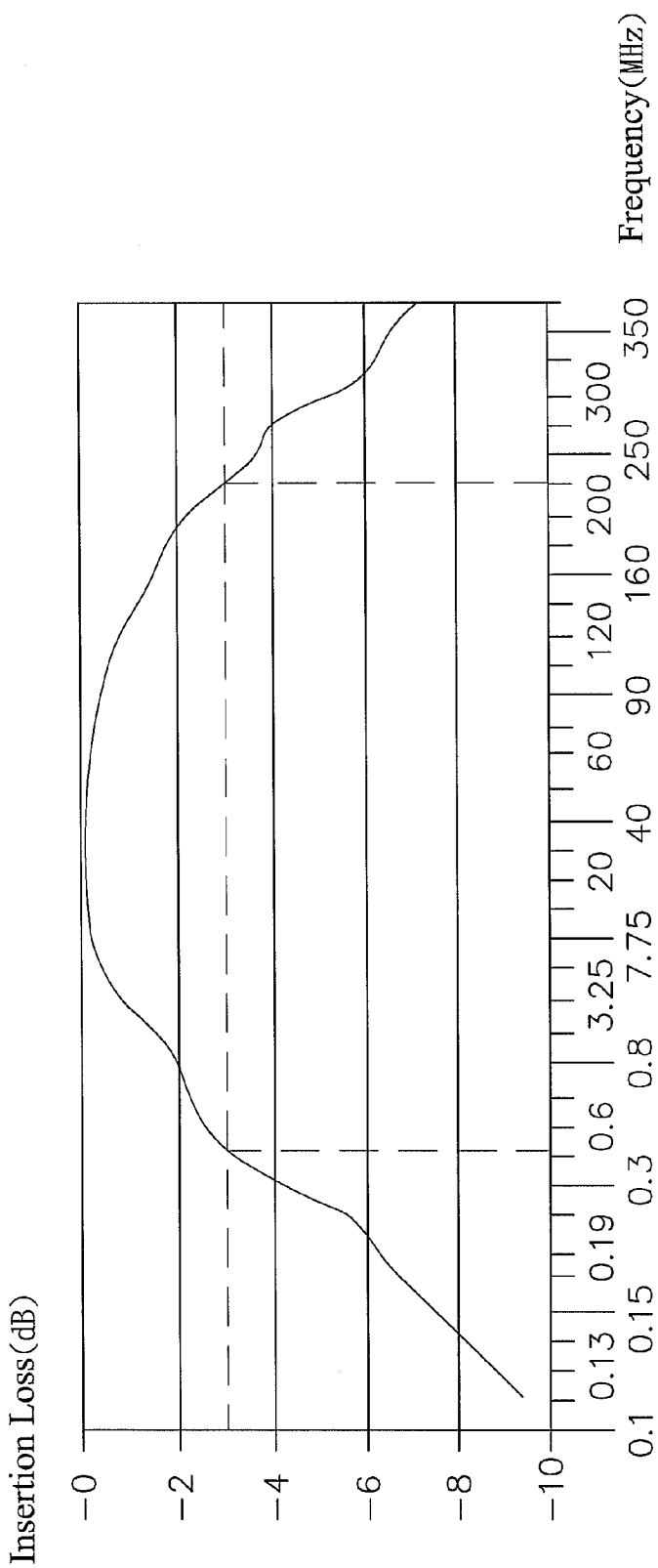
FIG. 7 is a frequency response curve of a conventional transformer.

Referring to FIG. 4 and FIG. 1 again, the network signal coupling circuit 1 and the network-on-chip 3 can be directly installed in the circuit board 4 and then electrically connected to the network connector 2. Alternatively, the network signal coupling circuit 1 can be installed in the circuit board 4 and then installed with the circuit board 4 in the network connector 2, and then the network connector 2 can be installed in an external circuit board and electrically connected to a network-on-chip 3 at the external circuit board. The network signal coupling circuit 1 in either of the aforesaid alternative arrangements can effectively couple signal between the network connector 2 and the network-on-chip 3 and provide a filtration effect. The arrangement of the network connector 2 and the network-on-chip 3 are of the known art and not within the spirit and scope of the invention. Therefore, no further detailed description in this regard is necessary.

Further, one equivalent resistor 142 of each coupling module 14 can be connected to an equivalent resistor of the cable of the network connector 2, and the other equivalent resistor 142 of each coupling module 14 can be connected to an internal equivalent impedance of the network-on-chip 3 to match with the respective capacitor 141.

In actual application, the invention has the advantages and features as follows:

1. The signal coupling circuit 1 comprises a plurality of channels 12 respectively formed of two circuits 121, and a coupling module 14 installed in the two circuits 121 of each channel 12 between opposing first connection end 10 and second connection end 11 of the signal coupling circuit 1, wherein each coupling module 14 comprises two capacitors 141 respectively electrically connected in series to the two circuits 121 of the respective channel 12, two sets of equivalent resistors 142 respectively electrically connected in parallel to opposing ends of the capacitors 141, and two signal equivalent grounding terminals 143 respectively electrically connected to the two sets of equivalent resistors 142; by means of the characteristic of the capacitors that the strength increases when the frequency rises, the signal coupling performance of the signal coupling circuit 1 is relatively enhanced when the applied network frequency is increased.
2. The two sets of equivalent resistors 142 of each coupling module 14 are connected in parallel to the opposing ends of the respective capacitors 141 and respectively electrically coupled to the signal equivalent grounding terminals 143 of which one is a grounding terminal 1431 and the other is a power supply voltage 1432 to achieve impedance matching.
3. The capacitor 141 at each circuit 121 of each channel 12 and the respective two connected equivalent resistors 142 constitute a respective π loop. This circuit design simply uses regular electronic components that can be directly bonded to a circuit board by an automatic machine without wire winding by labor, facilitating component quality control.

In conclusion, the invention provides a signal coupling circuit 1, which comprises a plurality of channels 12 respectively formed of two circuits 121, and a coupling module 14 installed in the two circuits 121 of each channel 12 between opposing first connection end 10 and second connection end 11 of the signal coupling circuit 1, wherein each coupling module 14 comprises two capacitors 141 respectively electrically connected in series to the two circuits 121 of the respective channel 12, two sets of equivalent resistors 142 respectively electrically connected in parallel to opposing ends of the capacitors 141, and two signal equivalent grounding terminals 143 respectively electrically connected to the two sets of equivalent resistors 142; by means of the characteristic of the capacitors that the strength increases when the frequency rises, the signal coupling performance of the signal coupling circuit 1 is relatively enhanced when the applied network frequency is increased.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A network signal coupling circuit installed in a circuit board, said circuit board carrying a network-on-chip and electrically connected to a network connector, the network signal coupling circuit comprising a plurality of channels, each said channel comprising two circuits, a coupling module installed in each said channel and respectively electrically connected to the two circuits of each said channel, each said coupling module comprising two capacitors respectively electrically connected to the two circuits of the respective channel, two sets of equivalent resistors respectively electrically connected in parallel to opposing ends of said capacitors, and two equivalent grounding terminals respectively electrically coupled with said two sets of equivalent resistors.

2. The network signal coupling circuit as claimed in claim 1, wherein each said channel comprises opposing first connection end and second connection end respectively electrically connected to said network connector and said network-on-chip; each said channel comprises a filter module having one end thereof electrically connected to the first connection end of the respective channel and an opposite end thereof electrically connected to the second connection end of the respective channel through one said coupling module, said filter module comprising a first coil and a second coil respectively electrically connected in series to the two circuits of the respective channel.

3. The network signal coupling circuit as claimed in claim 1, wherein the capacitor of each said coupling module at one circuit of one said channel and the respective two connected equivalent resistors constitute a respective π loop, the two π loops in each said channel being symmetric; one of said two signal equivalent grounding terminals that is electrically coupled with the equivalent resistors of the respective coupling module at one end of the capacitors of the respective coupling module relatively closer to the first connection end of the respective channel is a grounding terminal, and the other of said two signal equivalent grounding terminals that is electrically coupled with the equivalent resistors of the respective coupling module at the opposite end of the capacitors of the respective coupling module relatively closer to the second connection end of the respective channel is a power supply voltage.

4. The network signal coupling circuit as claimed in claim 1, wherein the circuits of said channels are configured to be MD0+/MX0+; MD0−/MX0−; MD1+/MX1+; MD1−/MX1−; MD2+/MX2+; MD2−/MX2−; MD3+/MX3+; MD3−/MX3−.

5. The network signal coupling circuit as claimed in claim 1, wherein said capacitors are high voltage capacitors matching with the respective equivalent resistors, and the matching capacitors are 0.1 µfarad capacitors; the equivalent resistors closer to said network-on-chip are 49.9Ω resistors; the equivalent resistors closer to said network connector are 75Ω resistors.

6. A network signal coupling circuit installed in a circuit board of a network connector being electrically connected to a network-on-chip, the network signal coupling circuit comprising a plurality of channels, each said channel comprising two circuits, a coupling module installed in each said channel and respectively electrically connected to the two circuits of each said channel, each said coupling module comprising two capacitors respectively electrically connected to the two circuits of the respective channel, two sets of equivalent resistors respectively electrically connected in parallel to opposing ends of said capacitors, and two equivalent grounding terminals respectively electrically coupled with said two sets of equivalent resistors.

7. The network signal coupling circuit as claimed in claim 6, wherein each said channel comprises opposing first connection end and second connection end respectively electrically connected to said network connector and said network-on-chip; each said channel comprises a filter module having one end thereof electrically connected to the first connection end of the respective channel and an opposite end thereof electrically connected to the second connection end of the respective channel through one said coupling module, said filter module comprising a first coil and a second coil respectively electrically connected in series to the two circuits of the respective channel.

8. The network signal coupling circuit as claimed in claim 6, wherein the capacitor of each said coupling module at one circuit of one said channel and the respective two connected equivalent resistors constitute a respective π loop, the two π loops in each said channel being symmetric; one of said two signal equivalent grounding terminals that is electrically coupled with the equivalent resistors of the respective coupling module at one end of the capacitors of the respective coupling module relatively closer to the first connection end of the respective channel is a grounding terminal, and the other of said two signal equivalent grounding terminals that is electrically coupled with the equivalent resistors of the respective coupling module at the opposite end of the capacitors of the respective coupling module relatively closer to the second connection end of the respective channel is a power supply voltage.

9. The network signal coupling circuit as claimed in claim 6, wherein the circuits of said channels are configured to be MD0+/MX0+; MD0−/MX0−; MD1+/MX1+; MD1−/MX1−; MD2+/MX2+; MD2−/MX2−; MD3+/MX3+; MD3−/MX3−.

10. The network signal coupling circuit as claimed in claim 6, wherein said capacitors are high voltage capacitors matching with the respective equivalent resistors, and the matching capacitors are 0.1 μfarad capacitors; the equivalent resistors closer to said network-on-chip are 49.9Ω resistors; the equivalent resistors closer to said network connector are 75Ω resistors.

* * * * *